(12) United States Patent
Cherniak et al.

(10) Patent No.: US 11,716,093 B2
(45) Date of Patent: Aug. 1, 2023

(54) DELTA-SIGMAL MODULATOR-BASED MULTI-RATE DIGITAL-TO-ANALOG CONVERTER WITH DIGITAL PRE-DISTORTION

(71) Applicant: Infineon Technologies AG, Neubiberg (DE)

(72) Inventors: Dmytro Cherniak, Villach (AT); Luigi Grimaldi, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/558,704

(22) Filed: Dec. 22, 2021

(65) Prior Publication Data

US 2023/0198544 A1    Jun. 22, 2023

(51) Int. Cl.
   *H03M 3/00* (2006.01)

(52) U.S. Cl.
   CPC ........... *H03M 3/358* (2013.01); *H03M 3/414* (2013.01); *H03M 3/496* (2013.01)

(58) Field of Classification Search
   CPC ........ H03M 3/00; H03M 3/496; H03M 3/358; H03M 3/414
   See application file for complete search history.

(56) References Cited

U.S. PATENT DOCUMENTS

| | | | | |
|---|---|---|---|---|
| 7,786,915 B1 * | 8/2010 | Kiper | ................... | H03M 3/388 375/296 |
| 8,294,605 B1 * | 10/2012 | Pagnanelli | ............. | H03M 3/30 341/145 |
| 9,276,602 B1 * | 3/2016 | Pagnanelli | .......... | H03M 1/1038 |
| 9,595,982 B2 * | 3/2017 | Weber | ................... | H03F 1/3247 |
| 10,404,267 B2 * | 9/2019 | Maehata | ............... | H03M 3/402 |
| 2011/0140942 A1 * | 6/2011 | Pagnanelli | .............. | H03M 3/50 341/144 |

(Continued)

OTHER PUBLICATIONS

Alvarez-Fontecilla, Enrique et al,. "Spectral Breathing and Its Mitigation in Digital Fractional-N PLLs." IEEE Journal of Solid-State Circuits. pp. 1-11. Jan. 4, 2021. doi: 10.1109/JSSC.2021.3074814.

(Continued)

*Primary Examiner* — Lam T Mai
(74) *Attorney, Agent, or Firm* — Harrity & Harrity, LLP

(57) ABSTRACT

A method of applying digital pre-distortion includes: outputting, by a look-up table, a first table value based on an input digital signal; adding the first table value and the input digital signal to generate a first combined signal comprising a first combined value having a first integer coefficient and a first fractional coefficient; separating the first integer coefficient from the first fractional coefficient to generate a first integer signal representing the first integer coefficient and a first fractional signal representing the first fractional coefficient; generating a delta-sigma modulated signal based on the first fractional signal; converting, by a first digital-to-analog, a first digital signal into a first analog signal, wherein the first digital signal is representative of the first integer signal; and converting, by a second DAC, a second digital signal into a second analog signal, wherein the second digital signal is representative of the delta-sigma modulated signal.

27 Claims, 3 Drawing Sheets

(56) References Cited

U.S. PATENT DOCUMENTS

| | | | | |
|---|---|---|---|---|
| 2013/0099949 | A1* | 4/2013 | Wagner | H03M 3/368 341/143 |
| 2014/0254720 | A1* | 9/2014 | Deng | H03F 3/19 330/251 |
| 2015/0061911 | A1* | 3/2015 | Pagnanelli | H03M 3/358 341/144 |
| 2017/0077945 | A1* | 3/2017 | Pagnanelli | H03F 3/45475 |
| 2017/0111188 | A1* | 4/2017 | Deng | H03F 3/45179 |
| 2017/0134055 | A1* | 5/2017 | Ebrahimi | H03M 3/02 |

OTHER PUBLICATIONS

Bhide, Ameya and Alvandpour, Atila. "An 11 GS/s 1.1 GHz Bandwidth Interleaved ΔΣ DAC for 60 GHz Radio in 65 nm CMOS." IEEE Journal of Solid-State Circuits. vol. 50. No. 10. pp. 2306-2318. Oct. 2015. doi: 10.1109/JSSC.2015.2460375.

Kong, Derui, et al. "A 600-MS/s DAC With Over 87-dB SFDR and 77-dB Peak SNDR Enabled by Adaptive Cancellation of Static and Dynamic Mismatch Error." IEEE Journal of Solid-State Circuits. vol. 54. No. 8. pp. 2219-2229. Aug. 2019. doi: 10.1109/JSSC.2019.2912338.

Su, Shiyu and Chen, Mike Shuo-Wei. "A 12-Bit 2 GS/s Dual-Rate Hybrid DAC With Pulse-Error Pre-Distortion and In-Band Noise Cancellation Achieving > 74 dBc SFDR and <−80 dBc IM3 up to 1 GHz in 65 nm CMOS." IEEE Journal of Solid-State Circuits. vol. 51. No. 12. pp. 2963-2978. Dec. 2016. doi: 10.1109/JSSC.2016.2594026.

Su, Shiyu and Chen, Mike Shuo-Wei. "A 16-bit 12-GS/s Single-/Dual-Rate DAC With a Successive Bandpass Delta-Sigma Modulator Achieving <−67-dBc IM3 Within DC to 6-GHz Tunable Passbands." IEEE Journal of Solid-State Circuits. vol. 53. No. 12. pp. 3517-3527. Dec. 2018. doi: 10.1109/JSSC.2018.2871143.

Su, Shiyu et al. "A 12 bit 1 GS/s Dual-Rate Hybrid DAC With an 8 GS/s Unrolled Pipeline Delta-Sigma Modulator Achieving >75 dB SFDR Over the Nyquist Band." IEEE Journal of Solid-State Circuits. vol. 50. No. 4. pp. 896-907. Apr. 2015. doi: 10.1109/JSSC.2014.2385752.

Wu, Wanghua et al. "A 56.4-to-63.4 GHz Multi-Rate All-Digital Fractional-N PLL for FMCW Radar Applications in 65 nm CMOS." IEEE Journal of Solid-State Circuits. vol. 49. No. 5. pp. 1081-1096. May 2014. doi: 10.1109/JSSC.2014.2301764.

* cited by examiner

DELTA-SIGMAL MODULATOR-BASED MULTI-RATE DIGITAL-TO-ANALOG CONVERTER WITH DIGITAL PRE-DISTORTION

BACKGROUND

There is a known trade-off in high-speed digital-to-analog converters (DACs) between static and dynamic nonlinearity. Often to improve dynamic performance of a high-speed DAC, a unit cells having small parasitic capacitance are utilized. However, this results in poor static matching performance. As a solution to the above-mentioned problem digital pre-distortion (DPD) is used. DPD is often done in a form of a look-up table (LUT) which precedes a DAC acting on its control word tw[k].

Some applications, such as wireless communication (e.g., 5G and 6G), radar, serializer/deserializer, require a clock frequency reaching multiple GHz (e.g., 1-10 GHz) which imposes significant complexity on implementation of the DPD and LUT. For instance, a typical 12-bit DAC would require a full-blown LUT of about 2 MB memory with read/write access at multi-GHz rate. Lowering complexity and, as a result, power consumption of the DPD (LUT) is desired.

SUMMARY

In some aspects, the techniques described herein relate to a system, including: a first digital-to-analog converter (DAC), wherein the first DAC is configured to receive a first digital signal and convert the first digital signal into a first analog signal; a second DAC configured to receive a second digital signal and convert the second digital signal into a second analog signal; and a digital pre-distortion circuit including: a look-up table configured to output a first table value based on an input digital signal; a first combiner circuit configured to add the first table value and the input digital signal to generate a first combined signal including a first combined value having a first integer coefficient and a first fractional coefficient; a first quantizer circuit configured to receive the first combined signal and separate the first integer coefficient from the first fractional coefficient to generate a first integer signal representing the first integer coefficient and a first fractional signal representing the first fractional coefficient, wherein the first digital signal is representative of the first integer signal; and a first delta-sigma modulator configured to generate a first delta-sigma modulated signal based on the first fractional signal, wherein the second digital signal is representative of the delta-sigma modulated signal.

In some aspects, the techniques described herein relate to a method of applying digital pre-distortion, the method including: outputting, by a look-up table, a first table value based on an input digital signal; adding the first table value and the input digital signal to generate a first combined signal including a first combined value having a first integer coefficient and a first fractional coefficient; separating the first integer coefficient from the first fractional coefficient to generate a first integer signal representing the first integer coefficient and a first fractional signal representing the first fractional coefficient; generating a delta-sigma modulated signal based on the first fractional signal; converting, by a first digital-to-analog (DAC), a first digital signal into a first analog signal, wherein the first digital signal is representative of the first integer signal; and converting, by a second DAC, a second digital signal into a second analog signal, wherein the second digital signal is representative of the delta-sigma modulated signal.

In some aspects, the techniques described herein relate to a system, including: a first digital-to-analog converter (DAC), wherein the first DAC is configured to receive a first digital signal and convert the first digital signal into a first analog signal; a second DAC configured to receive a second digital signal and convert the second digital signal into a second analog signal; and a digital pre-distortion circuit including: a first quantizer circuit configured to receive an input digital signal including an input integer coefficient and an input fractional coefficient, and separate the input integer coefficient from the input fractional coefficient to generate an input integer signal representing the input integer coefficient and an input fractional signal representing the input fractional coefficient; a look-up table configured to receive the input integer signal and output a first table value corresponding to the received input integer signal; a first combiner circuit configured to add the first table value and the input digital signal to generate a first combined signal including a first combined value having a first integer coefficient and a first fractional coefficient; a second quantizer circuit configured to receive the first combined signal and separate the first integer coefficient from the first fractional coefficient to generate a first integer signal representing the first integer coefficient and a first fractional signal representing the first fractional coefficient, wherein the first digital signal is representative of the first integer signal; and a delta-sigma modulator configured to generate a delta-sigma modulated signal based on the first fractional signal, wherein the second digital signal is representative of the delta-sigma modulated signal.

BRIEF DESCRIPTION OF THE DRAWINGS

Embodiments are described herein making reference to the appended drawings.

DETAILED DESCRIPTION

Figure 1:
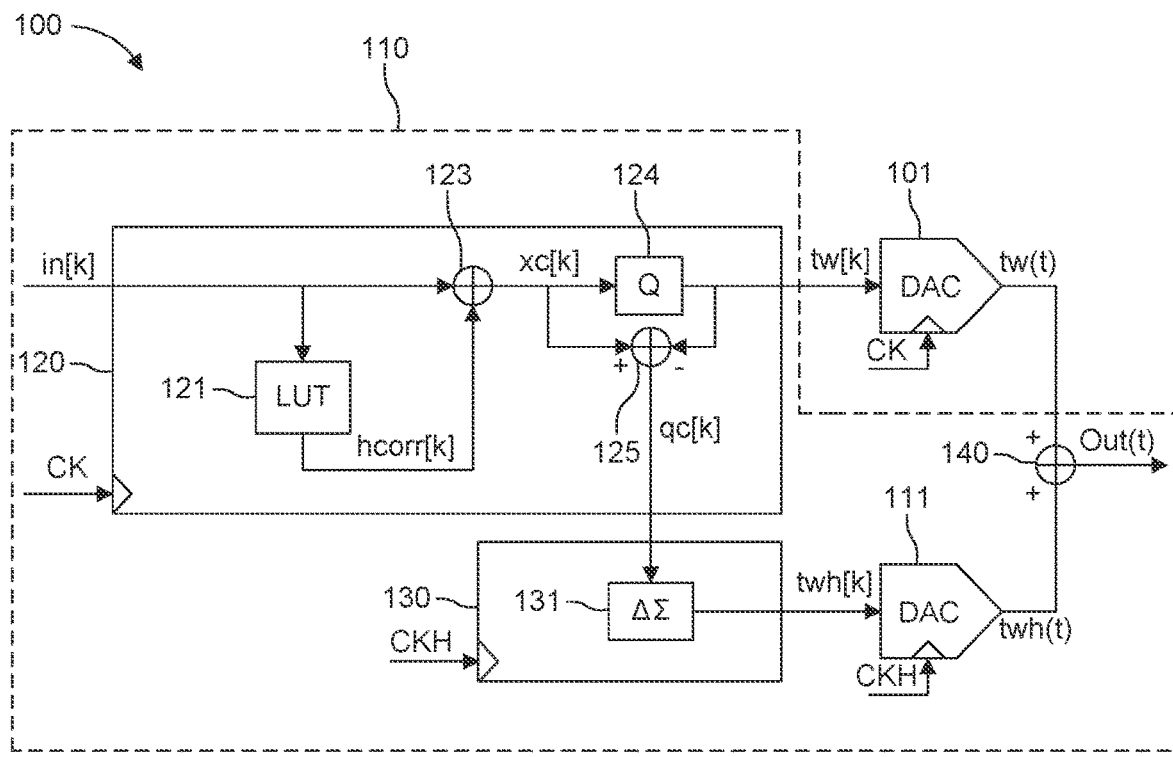
FIG. 1 illustrates a schematic block diagram of a system that includes a digital pre-distortion circuit and a primary digital-to-analog converter (DAC) according to one or more embodiments.
Figure 1:
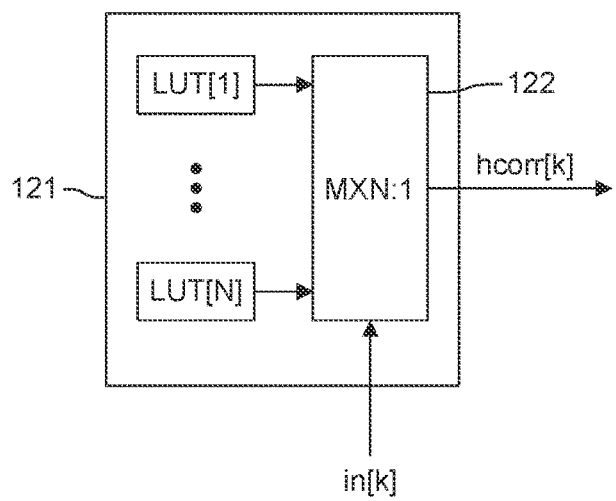

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

Accordingly, the term "processor," as used herein refers to any of the foregoing structures or any other structure suitable for implementation of the techniques described herein. A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

A signal processing circuit and/or a signal conditioning circuit may receive one or more signals from one or more components and perform signal conditioning or processing thereon. Signal conditioning, as used herein, refers to manipulating a signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning. Thus, a signal processing circuit may include an analog-to-digital converter (ADC) that converts the analog signal from the one or more sensor elements to a digital signal. The signal processing circuit may also include a DSP that performs some processing on the digital signal.

It will be appreciated that "(t)" denotes an analog signal defined as a continuous signal that may change over a time period t, and "(k)" denotes a digital signal defined as a discrete signal, where k is an integer and may represent a kth digital sample or a kth digital word. A signal may be represented with or without its analog or digital domain identifier (t) and (k), respectively.

In signal processing, oversampling is the process of sampling a signal at a sampling frequency significantly higher than the Nyquist rate. Theoretically, a bandwidth-limited signal can be perfectly reconstructed if sampled at the Nyquist rate or above it. The Nyquist rate is defined as twice the bandwidth of the signal. Oversampling is capable of improving resolution and signal-to-noise ratio, and can be helpful in avoiding aliasing and phase distortion by relaxing anti-aliasing filter performance requirements. A signal is said to be oversampled by a factor of X if it is sampled at X times the Nyquist rate.

FIG. 1 illustrates a schematic block diagram of a system 100 that includes a digital pre-distortion circuit and a primary digital-to-analog converter (DAC) according to one or more embodiments. The primary DAC (e.g., DAC 101) is configured to receive a digital signal (e.g., digital control word tw[k]) and convert the digital signal into an analog signal (e.g., an analog control signal). The digital pre-distortion circuit 110 is configured to compensate for a non-linearity of the primary DAC. In other words, the primary DAC 101 is the target of the non-linear compensation. The digital pre-distortion circuit 110 uses quantization in order to compensate for the non-linearity of the primary DAC 101. However, the quantization results in a quantization error. Accordingly, the digital pre-distortion circuit 110 further includes circuitry, including a second DAC 111, that is configured to receive the quantization error and further compensate for the quantization error.

The primary DAC 101 is configured to receive a first digital signal tw[k] and convert the first digital signal tw[k] into a first analog signal tw(t). The second DAC 111 is configured to receive a second digital signal twh[k] and convert the second digital signal twh[k] into a second analog signal twh(t). The two analog signals tw(t) and twh(t) are then combined (e.g., superimposed or added), for example, by combiner circuit 140 (e.g., adder), to generate an analog output signal out(t) that has been compensated for both the non-linearity of the primary DAC 101 and for the quantization error of the digital pre-distortion circuit 110.

The primary DAC 101 receives a first clock signal CK having a first frequency and is operated at this first frequency. For example, the primary DAC 101 performs sampling of digital signal tw[k] at the first frequency. The digital pre-distortion circuit 110 also receives the first clock signal CK. Accordingly, those components of the digital pre-distortion circuit 110 that receive the first clock signal CK are operated or driven at the first frequency. Additionally, the digital pre-distortion circuit 110 also receives the second clock signal CKH having a second frequency that is equal to or greater than the first frequency. Accordingly, those components of the digital pre-distortion circuit 110 that receive the second clock signal CKH are operated or driven at the second frequency. With the two clock frequencies being different (i.e., with the second clock frequency of CKH being greater than the first clock frequency of CK), the two clock frequencies define a multi-rate system.

The second frequency may be at least double the first frequency. In particular, the first frequency is a not an oversampling frequency relative to the input signal in[k] and the second frequency is an oversampling frequency relative to the input signal in[k]. Here, the Nyquist rate is defined as twice the bandwidth of the input signal in[k] that is received by the digital pre-distortion circuit 110.

The digital pre-distortion circuit 110 includes a first compensation circuit 120 that is configured to compensate for a non-linearity of DAC 101 and a second compensation circuit 130 that is configured to compensate for quantization errors of the first compensation circuit 120. The first compensation circuit 120 receives the first clock signal CK and is operated at the first frequency. The second compensation circuit 130 receives the second clock signal CKH and is operated at the second frequency. A second DAC 111 is operated with the second compensation circuit 130 to compensate for quantization errors of the first compensation circuit 120 and is also operated according to the second clock signal CKH. The second DAC 111 is configured to sample a second digital signal twh[k] (e.g., a second digital control word) at the second frequency (e.g., at an oversampling clock rate).

The first compensation circuit 120 includes an input that receives an input digital signal in[k] that is to be converted into an analog output signal. The input digital signal in[k] is fed into a look-up table (LUT) 121 that is configured to output a table value hcorr[k] based on the input digital signal in[k]. The LUT 121 contains an array of N table entries (LUT[1] ... LUT[N]) of m-length, where N is a number of physical elements in DAC 101 and m is the word length of correction signal hcorr[k].

For example, DAC 101 may include a bank of capacitors as physical elements and N is a number of capacitors in the DAC 101. Each of the table entry is associated with the particular physical element in DAC 101 to be corrected. The N table entries include different correction values for hcorr[k] that are used to compensate for the non-linearity of DAC 101, where the non-linearity is dependent on the input digital signal in[k]. Accordingly, the correction value hcorr[k] output by the LUT 121 is dependent on the input digital signal in[k].

In this example, the LUT 121 may include a multiplexer 122 that receives the input digital signal in[k] and selectively outputs a table entry from LUT[1] ... LUT[N] that corresponds to (i.e., is mapped to) the input digital signal in[k] as the correction value hcorr[k].

It is further noted that the table entries LUT[1] ... LUT[N] may include integer components (coefficients) and fractional components (coefficients). In other words, they are natural numbers that may include fractional (decimal) coefficients as well as integer coefficients. An integer coefficient may be represented by integer bits and a fractional (decimal) coefficient may be represented by fractional bits. Thus, the correction value hcorr[k] may have a fractional coefficient in addition to an integer coefficient. Likewise, the input digital signal in[k] may also have a fractional coefficient in addition to an integer coefficient.

The first compensation circuit 120 further includes a combiner circuit 123 (e.g., an adder) that combines (superimposes or adds) the input digital signal in[k] and the correction value hcorr[k] together to generate a combined signal xc[k] comprising a first combined value having a first integer coefficient and a first fractional coefficient. The pre-distortion of DAC 101 is performed by re-mapping the input control word in[k] to the control word tw[k] via the LUT 121 and combiner 123 such that characteristic of DAC 101 becomes linear.

The digital pre-distortion circuit 110 further includes a first quantizer circuit (quantizer (Q) 124 and combiner circuit 125) configured to receive the first combined signal xc[k] and separate the first integer coefficient from the first fractional coefficient to generate a first integer signal (e.g., tw[k]) representing the first integer coefficient and a first fractional signal qc[k] representing the first fractional coefficient. In this case, the first integer signal is the digital signal tw[k]. In other cases, a code converter may be provided between the first quantizer circuit and the DAC 101 to convert the first integer signal into a different digital code. For example, a binary-to-thermometer (B2T) code converter may be provided that converts the first integer signal int[k] from a binary code to a thermometer code such that the digital signal tw[k] is a thermometer code that is representative of the first integer signal.

The first quantizer circuit includes a quantizer 124 and a combiner circuit 125. The quantizer 124 is configured to quantize the first combined signal xc[k] to generate the first integer signal tw[k] that incudes quantized integer values and no fractional component. The combiner circuit 125 may be a subtractor. The combiner circuit 125 is configured to subtract the first integer signal tw[k] from the first combined signal xc[k] (e.g., xc[k]−tw[k]) to generate the first fractional signal qc[k]. Thus, the first fractional coefficient is a difference between the first combined value of the first combined signal xc[k] and the first integer coefficient of the first integer signal tw[k].

The first fractional signal qc[k] is the quantization error of the quantizer 124. Depending on the type of quantizer 124 used, the first fractional signal qc[k] and is limited to values equal to or greater than 0 and less than 1, to values equal to or less than 0 and greater than −1, or to values greater than −1 and less than +1. For example, the quantizer 124 may be perform a round up quantization operation, a round down quantization operation, or a delta-sigma modulation for generating the first integer signal. In other words, the absolute value of the quantization error is limited to values equal to or greater than 0 and less than 1 regardless of the type of quantizer used for quantizer 124.

According, the range of possible values of the first fractional signal qc[k] is small. This allows a narrow-range design of the second DAC 111, which in turn enables better linearity and power consumption. The smaller range also works better with an oversampling clock frequency. The higher clock frequency of CKH also allows the imperfections of the second DAC 111 to be ignored. For example, the oversampling clock frequency of CKH pushes the noise produced by the second DAC 111 to a higher frequency that can be more easily ignored or filtered.

The digital pre-distortion circuit 110 further includes a delta-sigma (ΔΣ) modulator 131 configured to generate a delta-sigma modulated signal (e.g., dsm[k] or twh[k]) based on the first fractional signal qc[k]. In this case, the delta-sigma modulated signal is the digital signal twh[k]. In other cases, a code converter may be provided between the delta-sigma modulator 131 and the DAC 111 to convert the delta-sigma modulated signal into a different digital code. For example, a binary-to-thermometer (B2T) code converter may be provided that converts the delta-sigma modulated signal from a binary code to a thermometer code such that the digital signal twh[k] is a thermometer code that is representative of the delta-sigma modulated signal.

The delta-sigma modulated signal comprises integer values and no fractional components. The average of the delta-sigma modulated signal over time is equal to the first fractional signal qc[k] over time. Delta-sigma modulators are sometimes also referred to in the literature as sigma-delta modulators.

The first fractional signal qc[k] may comprise one or more signals (e.g., digital words) that represent rational numbers (first fractional coefficients) and the output signal of the delta-sigma modulator 131 is a sequence of signals that comprise whole numbers (natural numbers) with no fractional component. By way of example, the output signal of the delta-sigma modulator 131 comprises a higher sampling rate due to the higher clock frequency of CKH than its input signal qc[k] that is generated according to clock signal CK. As a result, the output signal of the delta-sigma modulator 131, on average, represents signal values of its input signal through a sequence of whole numbers (e.g., 0 and 1) of the output signal. Since the range of the first fractional signal qc[k] is limited to a small range of rational numbers (e.g., from 0 and less than 1), the output signal of the delta-sigma modulator 131 can be limited to whole number values of 0 and 1. A sequence of zeros and ones may be output at the higher clock frequency such that the average of the output is equal to qc[k] (i.e., a rational number or a fractional value). In other words, the output signal may be described as a discrete representation of the input signal. Over a particular time interval, an average value and/or an accumulated value of the output signal of the delta-sigma modulator 131 is identical or at least similar to the corresponding average value and/or accumulated value of its input signal.

The second DAC 111 receives the delta-sigma modulated signal dsm[k] as the digital signal twh[k] and converts it into an analog signal twh(t). The combiner circuit 140 receives the two analog signals tw(t) and twh(t) and combines them to generate the analog output signal out(t) that has been compensated for both the non-linearity of the primary DAC 101 and for the quantization error of the digital pre-distortion circuit 110.

The system 100 may be implemented in a control circuit of a digitally-controlled oscillator (DCO), wherein the digital control words tw[k] and twh[k] are used to control the generation of an analog signal (e.g., out(t)) by the DCO. The two DACs 101 and 111 in such an application are representative of the DCO and out(t) is a DCO output.

In view of the above, the digital pre-distortion circuit 110 performs linearization of the primary DAC 101 by compensating for its nonlinearity at its own input. The non-linearity compensation is achieved by the LUT 121 such that non-linearity of the DAC 101 is already pre-compensated in the digital signal tw[k] that is received at the input of the primary DAC 101. Only an error signal represented by a fractional part is forwarded to the second DAC 111 to compensate for the quantization error qc[k].

Figure 2:
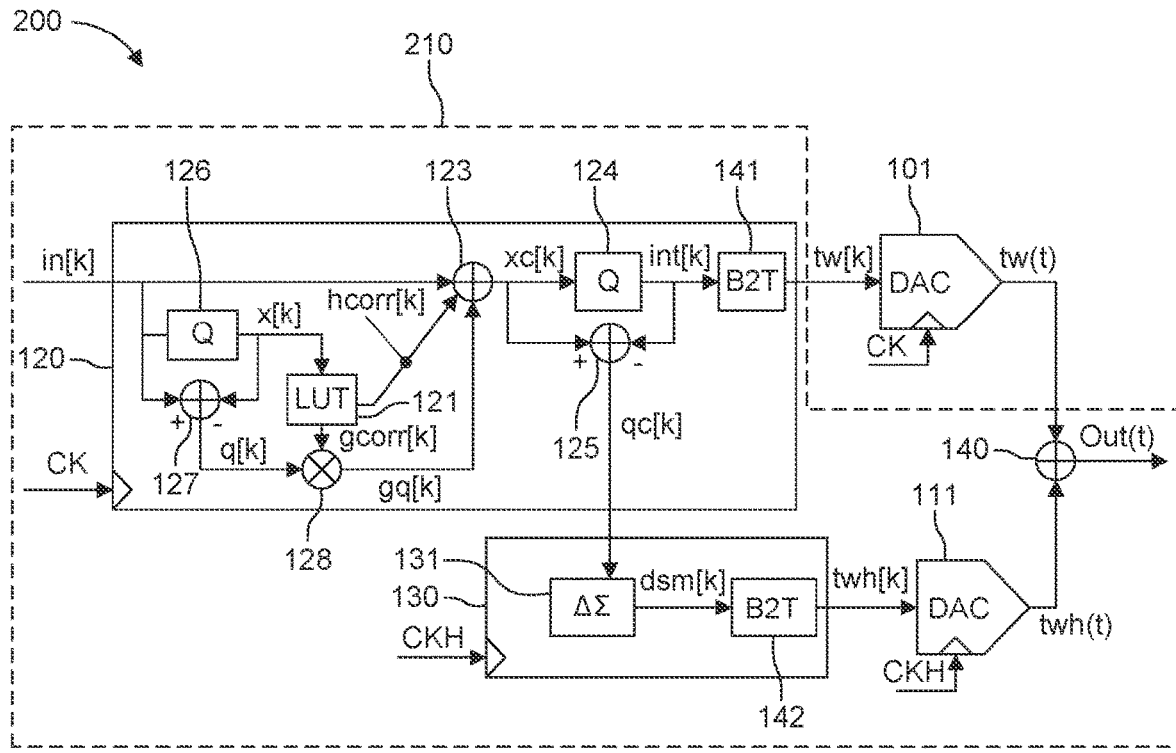
FIG. 2 illustrates a schematic block diagram of a system that includes a digital pre-distortion circuit and a primary DAC according to one or more embodiments.
Figure 2:
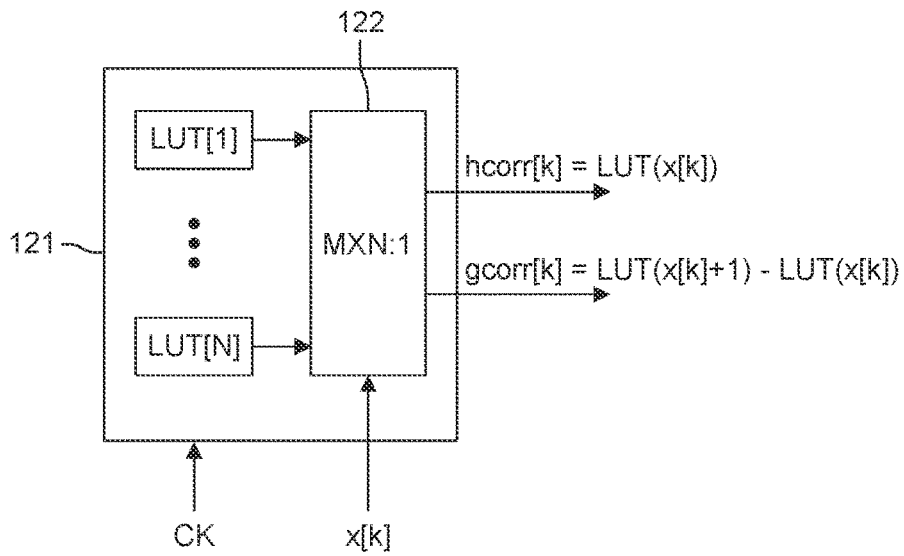

FIG. 2 illustrates a schematic block diagram of a system 200 that includes a digital pre-distortion circuit and a primary DAC according to one or more embodiments. The primary DAC (e.g., DAC 101) is configured to receive a digital signal (e.g., digital control word tw[k]) and convert the digital signal into an analog signal (e.g., an analog control signal). The digital pre-distortion circuit 210 is configured to compensate for a non-linearity of the primary DAC. In other words, the primary DAC 101 is the target of the non-linear compensation. The digital pre-distortion circuit 210 uses quantization in order to compensate for the non-linearity of the primary DAC 101. However, the quantization results in a quantization error. Accordingly, the digital pre-distortion circuit 210 further includes circuitry, including a second DAC 111, that is configured to receive the quantization error and further compensate for the quantization error.

The primary DAC 101 is configured to receive a first digital signal tw[k] and convert the first digital signal tw[k] into a first analog signal tw(t). The second DAC 111 is configured to receive a second digital signal twh[k] and convert the second digital signal twh[k] into a second analog signal twh(t). The two analog signals tw(t) and twh(t) are then combined (e.g., superimposed or added), for example, by combiner circuit 140 (e.g., adder), to generate an analog output signal out(t) that has been compensated for both the non-linearity of the primary DAC 101 and for the quantization error of the digital pre-distortion circuit 110.

Specifically, the digital pre-distortion circuit 210 includes a first compensation circuit 120 that is configured to compensate for a non-linearity of DAC 101 and a second compensation circuit 130 that is configured to compensate for quantization errors of the first compensation circuit 120. The primary DAC 101 and the first compensation circuit 120 receive the first clock signal CK having the first frequency. The second DAC 111 and the second compensation circuit 130 receives the second clock signal CKH having the second frequency.

The pre-distortion of DAC 101 is performed by re-mapping the input control word in[k] to the control word tw[k] via the LUT 121 and combiner 123 such that characteristic of DAC 101 becomes linear. In this embodiment, the LUT 121 does not directly receive the input digital signal in[k]. Instead, an additional quantization circuit, including a quantizer 126 and a combination circuit 127, receives the input digital signal in[k]. The additional quantization circuit is particularly useful if the input digital signal in[k] includes rational numbers that include fractional components. In other words, the input digital signal in[k] can include an input integer coefficient and an input fractional coefficient. An integer coefficient may be represented by integer bits and a fractional (decimal) coefficient may be represented by fractional bits. The additional quantization circuit is able to parse out the input integer coefficient and the input fractional coefficient into separate signals. Thus, the additional quantization circuit is configured to receive the input digital signal in[k] and separate the input integer coefficient from the input fractional coefficient to generate an input integer signal x[k] representing the input integer coefficient and an input fractional signal q[k] representing the input fractional coefficient.

The LUT 121 is configured to receive the input integer signal x[k] and simultaneously output two table values (i.e., two correction values) hcorr[k] and gcorr[k], in parallel, corresponding to the received input integer signal x[k]. As before, each table entry LUT[1] . . . LUT[N] is mapped to a different integer coefficient. Thus, the LUT 121 selects the table entry LUT[1] . . . LUT[N] that corresponds to the integer coefficient received in the input integer signal x[k] and outputs the selected table entry as the first correction value hcorr[k] (i.e., hcorr[k]=LUT(x[k])). The output of the two correction values is synchronous with a clock pulse of the clock signal CK.

The LUT 121 also calculates the second correction value gcorr[k] from two adjacent table entries LUT[1] . . . LUT[N] but, for example, calculating a difference between the two adjacent table entries and outputting the difference as the second correction value gcorr[k]. For example, the LUT 121 may extract the value from the table entry that is mapped to the integer coefficient of the input integer signal x[k] (i.e., LUT(x[k])), may extract the value from the table entry that is mapped to the next integer coefficient (x[k]+1) (i.e., LUT(x[k]+1)), and may subtract the two extracted table values to obtain the second correction value gcorr[k]. Thus, the second correction value gcorr[k]=LUT(x[k]+1)−LUT(x[k])).

Alternatively, a second set of table entries may be used for gcorr[k], wherein each table entry of the second set is mapped to a different integer coefficient and the LUT 121 selects the table entry from the second set that corresponds to the integer coefficient received in the input integer signal x[k] and outputs the selected table entry as the second correction value gcorr[k] (i.e., gcorr[k]=LUT(x[k])).

The quantizer 126 may be any type of quantizer (i.e., round up, round down, delta-sigma modulator, etc.) and is configured to quantize the input digital signal in[k] to generate the input integer signal x[k] comprising quantized integer values and no fractional component. The combiner circuit 127 may be a subtractor. The combiner circuit 127 is configured to subtract the input integer signal x[k] from the input integer signal in[k] (e.g., in[k]−x[k]) to generate the input fractional signal q[k]. Thus, the input fractional coefficient is a difference between the input code word of in[k] and the input integer coefficient of x[k].

The input fractional signal q[k] is the quantization error of the quantizer 126 whose values have a limited range. Thus, it is an error signal. Depending on the type of quantizer 124 used, the input fractional signal q[k] is limited to values equal to or greater than 0 and less than 1, to values equal to or less than 0 and greater than −1, or to values greater than −1 and less than +1.

The second correction value gcorr[k] and the input fractional signal q[k] are provided to a multiplier 128 that is configured to multiply the input fractional signal q[k] with the second correction value gcorr[k] to generate a scaled fractional signal gq[k]. Thus, the second signal gcorr[k] is used to scale error signal q[k] produced by quantization of the input signal in[k] by the quantizer 126.

The combiner circuit 123 receives the input digital signal in[k], the first correction value hcorr[k], and the scaled fractional signal gq[k] and combines (superimposes or adds) the three signals together to generate the first combined signal xc[k]. As before, the first combined signal xc[k] contains an integer part and a fractional part. Specifically, the first combined signal xc[k] is a first combined value having a first integer coefficient and a first fractional coefficient.

The first quantizer circuit, including the quantizer 124 and the combiner circuit 125, receives the first combined signal xc[k] from combiner circuit 123. The quantizer 124 is configured to quantize the first combined signal xc[k] to generate the first integer signal int[k] that incudes quantized integer values and no fractional component. The combiner circuit 125 is a subtractor that subtracts the first integer signal int[k] from the first combined signal xc[k] (e.g., xc[k]−int[k]) to generate the first fractional signal qc[k]. Thus, the first fractional coefficient is a difference between the first combined value of the first combined signal xc[k] and the first integer coefficient of the first integer signal int[k].

In this example, a code converter 141, such as a B2T converter, is arranged between the output of quantizer 124 and DAC 101. The code converter 141 is configured to convert the first integer coefficient of the first integer signal int[k] into a different code to generate the first digital signal tw[k]. Accordingly, the first digital signal tw[k] is representative of the first integer signal ink[k].

The delta-sigma modulator 131 receives the first fractional signal qc[k] and operates as described above to generate a delta-sigma modulated signal dsm[k]. In this case, a code converter 142, such as a B2T converter, is arranged between the output of delta-sigma modulator 131 and DAC 111. The code converter 142 is configured to convert the integer values of the delta-sigma modulated signal dsm[k] into a different code to generate the second digital signal twh[k]. Accordingly, the second digital signal twh[k] is representative of the delta-sigma modulated signal dsm[k].

Accordingly, the integer part of the combined signal xc[k] results in the control code tw[k] for DAC 101 and the fractional part qc[k] of the combined signal xc[k] is applied to the oversampled DAC 111 that is driven by the delta-sigma modulator 131. The combiner circuit 140 (e.g., adder) combines the two analog signals tw(t) and twh(t) to generate an analog output signal out(t) that has been compensated for both the non-linearity of the primary DAC 101 and for the quantization error qc[k] of the digital pre-distortion circuit 210. The quantization error qc[k] is a result of the fractional component of the input digital signal in[k], the fractional component of the first correction value hcorr[k], or both.

Figure 3:
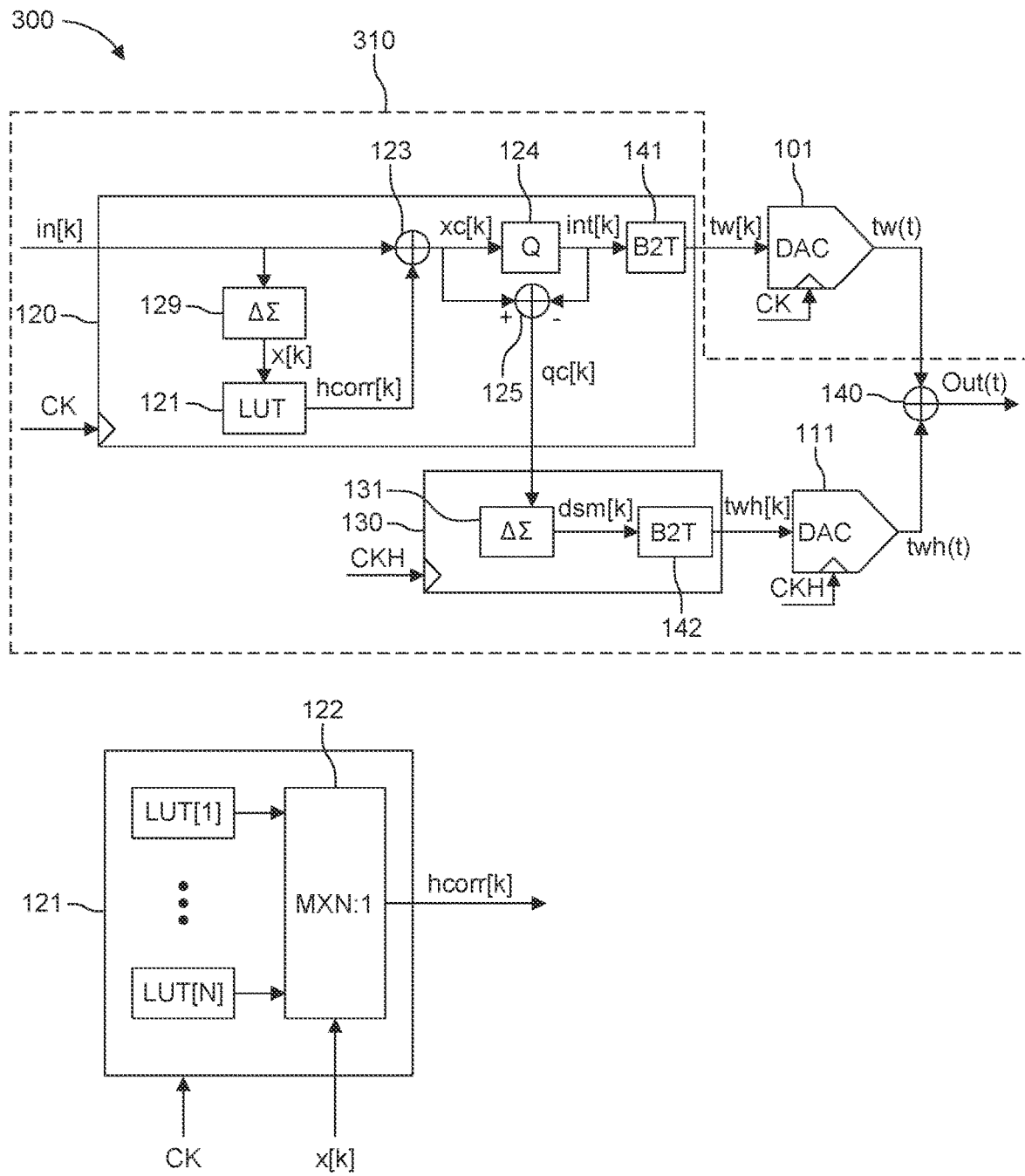
FIG. 3 illustrates a schematic block diagram of a system that includes a digital pre-distortion circuit and a primary DAC according to one or more embodiments.

FIG. 3 illustrates a schematic block diagram of a system 300 that includes a digital pre-distortion circuit and a primary DAC according to one or more embodiments. The primary DAC (e.g., DAC 101) is configured to receive a digital signal (e.g., digital control word tw[k]) and convert the digital signal into an analog signal (e.g., an analog control signal). The digital pre-distortion circuit 310 is configured to compensate for a non-linearity of the primary DAC. In other words, the primary DAC 101 is the target of the non-linear compensation. The digital pre-distortion circuit 310 uses quantization in order to compensate for the non-linearity of the primary DAC 101. However, the quantization results in a quantization error. Accordingly, the digital pre-distortion circuit 310 further includes circuitry, including a second DAC 111, that is configured to receive the quantization error and further compensate for the quantization error.

In this embodiment, the first compensation circuit 120 includes an additional delta-sigma modulator 129 that is used to drive the LUT 121. This allows the first compensation circuit 120 to process an input digital signal in[k] that includes fractional components without adding a multiplier 128 and arithmetic for computing gcorr[k] for simplifying the digital logic of the first compensation circuit 120.

The delta-sigma modulator 129 is configured to receive the input digital signal in[k] and output a delta-sigma modulated signal x[k] based on the input digital signal in[k]. The delta-sigma modulated signal x[k] consists only of integer values (whole numbers). The delta-sigma modulator 129 outputs a sequence of integers, the average of which is equal to or substantially equal to the input digital signal in[k]. The LUT 121 is configured to receive the delta-sigma modulated signal x[k] and output the first table value hcorr[k] corresponding to the received delta-sigma modulated signal x[k]. In general, signal x[k] is a quantized signal having quantized integer values. The LUT 121 selectively outputs the table entry that is mapped to the received quantized integer value of signal x[k] as the first correction value hcorr[k].

The delta-sigma modulator 129 allows the LUT 121 to produce an averaged correction with respect to fractional part of the in[k] signal. The associated quantization error is shaped with correspondent to delta-sigma modulator order profile. Thus, higher order interpolations (e.g., 1st order, 2nd order, 3rd order, etc.) are possible.

The digital pre-distortion circuits 110, 210, and 310 are capable of linearizing a DCO within digital phase-locked loop (PLL). A DCO is a highly nonlinear block which exhibits $1/\sqrt{x}$-like intrinsic nonlinearity as well as inductive and capacitive dependent nonlinearities caused by physical placement and mismatches. The digital pre-distortion circuits 110, 210, and 310 would allow the DCO to generate highly-linear chirps signals (e.g., radar ramp signals that includes a sequency of linear frequency ramps). The DACs 101 and 111 may be part of a DCO that is controlled by input digital signal [k] that is processed by the digital pre-distortion circuit 110, 210, or 310. Thus, the digital pre-distortion circuits 110, 210, and 310 may be part of control circuitry used for generating control words tw[k] and twh[k] that control the DCO.

While various embodiments have been described, it will be apparent to those of ordinary skill in the art that many more embodiments and implementations are possible within the scope of the disclosure. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Instructions may be executed by one or more processors, such as one or more central processing units (CPUs), digital signal processors (DSPs), general purpose microprocessors, application specific integrated circuits (ASICs), field programmable logic arrays (FPGAs), or other equivalent integrated or discrete logic circuitry. Accordingly, the term "processor" or "processing circuitry" as used herein refers to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements.

Thus, the techniques described in this disclosure may be implemented, at least in part, in hardware, software, firmware, or any combination thereof. For example, various aspects of the described techniques may be implemented within one or more processors, including one or more microprocessors, DSPs, ASICs, or any other equivalent integrated or discrete logic circuitry, as well as any combinations of such components.

A controller including hardware may also perform one or more of the techniques described in this disclosure. Such hardware, software, and firmware may be implemented within the same device or within separate devices to support the various techniques described in this disclosure. Software may be stored on a non-transitory computer-readable medium such that the non-transitory computer readable medium includes a program code or a program algorithm stored thereon which, when executed, causes the controller, via a computer program, to perform the steps of a method.

Although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized, and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A system, comprising:
   a first digital-to-analog converter (DAC), wherein the first DAC is configured to receive a first digital signal and convert the first digital signal into a first analog signal;
   a second DAC configured to receive a second digital signal and convert the second digital signal into a second analog signal; and
   a digital pre-distortion circuit comprising:
   a look-up table configured to output a first table value based on an input digital signal;
   a first combiner circuit configured to add the first table value and the input digital signal to generate a first combined signal comprising a first combined value having a first integer coefficient and a first fractional coefficient;
   a first quantizer circuit configured to receive the first combined signal and separate the first integer coefficient from the first fractional coefficient to generate a first integer signal representing the first integer coefficient and a first fractional signal representing the first fractional coefficient, wherein the first digital signal is representative of the first integer signal; and
   a first delta-sigma modulator configured to generate a first delta-sigma modulated signal based on the first fractional signal, wherein the second digital signal is representative of the first delta-sigma modulated signal.

2. The system of claim 1, wherein the first fractional coefficient is a difference between the first combined value and the first integer coefficient.

3. The system of claim 1, wherein the first delta-sigma modulated signal comprises integer values and an average of the first delta-sigma modulated signal over time is equal to the first fractional signal over time.

4. The system of claim 1, further comprising:
a second combiner circuit configured to combine the first analog signal and the second analog signal to generate an analog output signal.

5. The system of claim 1, wherein:
the first DAC converter is configured to receive a first clock signal having a first frequency and perform sampling of the first digital signal at the first frequency, and
the second DAC converter is configured to receive a second clock signal having a second frequency that is greater than the first frequency and perform sampling of the second digital signal at the second frequency.

6. The system of claim 5, wherein the first frequency is a non-oversampling frequency and the second frequency is an oversampling frequency.

7. The system of claim 5, wherein the second frequency is at least double the first frequency.

8. The system of claim 5, wherein:
the look-up table, the first combiner circuit, and the first quantizer circuit are configured to receive the first clock signal and operate at the first frequency, and
the first delta-sigma modulator is configured to receive the second clock signal and operate at the second frequency.

9. The system of claim 1, wherein the first quantizer circuit comprises:
a quantizer configured to quantize the first combined signal to generate the first integer signal comprising quantized integer values; and
a second combiner circuit configured to subtract the first integer signal and the first combined signal to generate the first fractional signal.

10. The system of claim 1, wherein the look-up table is configured to receive the input digital signal and output the first table value corresponding to the received input digital signal.

11. The system of claim 1, wherein:
the input digital signal comprises an input integer coefficient and an input fractional coefficient, and
the system further comprises:
a second quantizer circuit configured to receive the input digital signal and separate the input integer coefficient from the input fractional coefficient to generate an input integer signal representing the input integer coefficient and an input fractional signal representing the input fractional coefficient,
wherein the look-up table is configured to receive the input integer signal and output the first table value corresponding to the received input integer signal.

12. The system of claim 11, wherein the input fractional coefficient is a difference between the input digital signal and the input integer coefficient.

13. The system of claim 11, wherein the second quantizer circuit comprises:
a quantizer configured to quantize the input digital signal to generate the input integer signal comprising quantized integer values; and
a second combiner circuit configured to subtract the input integer signal and the input digital signal to generate the input fractional signal.

14. The system of 11, wherein:
the look-up table is configured to receive the input integer signal and simultaneously output the first table value corresponding to the received input integer signal and a second table value corresponding to the input integer signal,
the system further comprises a multiplier configured to multiply the input fractional signal with the second table value to generate a scaled fractional signal, and
the first combiner circuit is configured to add the first table value, the input digital signal, and the scaled fractional signal to generate the first combined signal comprising the first combined value having the first integer coefficient and the first fractional coefficient.

15. The system of claim 1, wherein:
the first DAC converter is configured to receive a first clock signal having a first frequency and perform sampling of the first digital signal at the first frequency,
the second DAC converter is configured to receive a second clock signal having a second frequency that is greater than the first frequency and perform sampling of the second digital signal at the second frequency
the look-up table, the first combiner circuit, and the first quantizer circuit, the second quantizer circuit, and the multiplier are configured to receive the first clock signal and operate at the first frequency, and
the first delta-sigma modulator is configured to receive the second clock signal and operate at the second frequency.

16. The system of claim 1, further comprising:
a second delta-sigma modulator configured to generate a second delta-sigma modulated signal based on the input digital signal,
wherein the look-up table is configured to receive the second delta-sigma modulated signal and output the first table value corresponding to the received second delta-sigma modulated signal.

17. The system of claim 1, wherein the look-up table is configured to compensate for a non-linearity of the first DAC and the second analog signal is configured to compensate for a quantization error of the first quantizer circuit.

18. The system of claim 1, wherein the look-up table is configured to selectively output the first table value to compensate for a non-linearity of the first DAC such that non-linearity is compensated in the first digital signal at an input of the first DAC.

19. The system of claim 1, wherein the first integer signal is the first digital signal and the first delta-sigma modulated signal is the second digital signal.

20. The system of claim 1, further comprising:
a first converter configured to convert the first integer signal into the first digital signal; and
a second converter configured to convert the first delta-sigma modulated signal into the second digital signal.

21. The system of claim 1, wherein the system is implemented in a control circuit of a digitally-controlled oscillator.

22. A method of applying digital pre-distortion, the method comprising:
outputting, by a look-up table, a first table value based on an input digital signal;

adding the first table value and the input digital signal to generate a first combined signal comprising a first combined value having a first integer coefficient and a first fractional coefficient;

separating the first integer coefficient from the first fractional coefficient to generate a first integer signal representing the first integer coefficient and a first fractional signal representing the first fractional coefficient;

generating a delta-sigma modulated signal based on the first fractional signal;

converting, by a first digital-to-analog (DAC), a first digital signal into a first analog signal, wherein the first digital signal is representative of the first integer signal; and converting, by a second DAC, a second digital signal into a second analog signal, wherein the second digital signal is representative of the delta-sigma modulated signal.

23. The method of claim 22, further comprising:

operating the first DAC at a first clock frequency;

operating the second DAC at a second clock frequency that is greater than the first frequency, wherein the second analog signal is configured to compensate for a quantization error that occurs during separating the first integer coefficient from the first fractional coefficient.

24. A system, comprising:

a first digital-to-analog converter (DAC), wherein the first DAC is configured to receive a first digital signal and convert the first digital signal into a first analog signal;

a second DAC configured to receive a second digital signal and convert the second digital signal into a second analog signal; and a digital pre-distortion circuit comprising:

a first quantizer circuit configured to receive an input digital signal comprising an input integer coefficient and an input fractional coefficient, and separate the input integer coefficient from the input fractional coefficient to generate an input integer signal representing the input integer coefficient and an input fractional signal representing the input fractional coefficient;

a look-up table configured to receive the input integer signal and output a first table value corresponding to the received input integer signal;

a first combiner circuit configured to add the first table value and the input digital signal to generate a first combined signal comprising a first combined value having a first integer coefficient and a first fractional coefficient;

a second quantizer circuit configured to receive the first combined signal and separate the first integer coefficient from the first fractional coefficient to generate a first integer signal representing the first integer coefficient and a first fractional signal representing the first fractional coefficient, wherein the first digital signal is representative of the first integer signal; and a delta-sigma modulator configured to generate a delta-sigma modulated signal based on the first fractional signal, wherein the second digital signal is representative of the delta-sigma modulated signal.

25. The system of claim 24, wherein the first quantizer circuit comprises:

a first quantizer configured to quantize the input digital signal to generate the input integer signal comprising quantized integer values; and a second combiner circuit configured to subtract the input integer signal and the input digital signal to generate the input fractional signal.

26. The system of claim 25, wherein the second quantizer circuit comprises:

a second quantizer configured to quantize the first combined signal to generate the first integer signal comprising quantized integer values; and a third combiner circuit configured to subtract the first integer signal and the first combined signal to generate the first fractional signal.

27. The system of 24, wherein:

the look-up table is configured to receive the input integer signal and simultaneously output the first table value corresponding to the received input integer signal and a second table value corresponding to the input integer signal, the system further comprises a multiplier configured to multiply the input fractional signal with the second table value to generate a scaled fractional signal, and the first combiner circuit is configured to add the first table value, the input digital signal, and the scaled fractional signal to generate the first combined signal comprising the first combined value having the first integer coefficient and the first fractional coefficient.

* * * * *